(12) United States Patent
Henson et al.

(10) Patent No.: US 7,410,851 B2
(45) Date of Patent: Aug. 12, 2008

(54) LOW VOLTAGE SUPERJUNCTION MOSFET

(75) Inventors: Timothy Henson, Torrance, CA (US);
Jianjun Cao, Torrance, CA (US)

(73) Assignee: International Rectifier Corporation, El Segundo, CA (US)

( * ) Notice: Subject to any disclaimer, the term of this patent is extended or adjusted under 35 U.S.C. 154(b) by 453 days.

(21) Appl. No.: 10/746,334

(22) Filed: Dec. 23, 2003

(65) Prior Publication Data
US 2004/0137666 A1 Jul. 15, 2004

Related U.S. Application Data

(60) Continuation-in-part of application No. 10/644,306, filed on Aug. 20, 2003, now Pat. No. 6,846,706, which is a division of application No. 10/187,580, filed on Jul. 1, 2002, now Pat. No. 6,639,276.

(60) Provisional application No. 60/303,059, filed on Jul. 5, 2001, provisional application No. 60/436,558, filed on Dec. 23, 2002.

(51) Int. Cl.
*H01L 21/336* (2006.01)

(52) U.S. Cl. .................................. 438/197; 438/279
(58) Field of Classification Search ................. 438/197, 438/279
See application file for complete search history.

(56) References Cited

U.S. PATENT DOCUMENTS

| 6,096,606 | A | 8/2000 | Merchant |
| 6,380,569 | B1 * | 4/2002 | Chang et al. ................. 257/256 |

FOREIGN PATENT DOCUMENTS

| JP | 06163906 | 6/1994 |
| JP | 0982965 | 3/1997 |
| WO | WO 00/74141 | 12/2000 |

OTHER PUBLICATIONS

European Search Report issued by the European Patent Office in EP Application No. 02748066 on Feb. 28, 2008.

* cited by examiner

*Primary Examiner*—Jack Chen
(74) *Attorney, Agent, or Firm*—Ostrolenk, Faber, Gerb & Soffen, LLP

(57) ABSTRACT

A power semiconductor switching device such as a power MOSFET that includes breakdown voltage enhancement regions formed by self-alignment.

6 Claims, 5 Drawing Sheets

LOW VOLTAGE SUPERJUNCTION MOSFET

RELATED APPLICATION

This application is a continuation-in-part of U.S. patent application Ser. No. 10/644,306, filed Aug. 20, 2003, which is a divisional application of U.S. patent application Ser. No. 10/187,580, filed on Jul. 1, 2002, which is now U.S. Pat. No. 6,639,276, issued on Oct. 28, 2003 and entitled Power MOSFET With Ultra-deep Base and Reduced ON Resistance which claimed priority to U.S. Provisional Application No. 60/303,059, filed Jul. 5, 2001. A claim of priority to the common subject matter of the foregoing applications is hereby made. This application also claims benefit of U.S. Provisional Application No. 60/436,558, filed on Dec. 23, 2002, entitled Low Voltage Super Junction MOSFET Simulation and Experimentation, to which a claim of priority is hereby made.

BACKGROUND OF THE INVENTION

Referring to FIG. 1A, a conventional power MOSFET includes spaced channel regions 10 of one conductivity type, which are formed in semiconductor body 12 of an opposite conductivity type. As is conventional semiconductor body 12 is formed over a semiconductor substrate 14 of the same conductivity through, for example, epitaxial growth. Formed in each channel region 10 is a respective source region 16 of an opposite conductivity. Each source region 16 is contained within a corresponding channel region and is thus spaced apart from semiconductor body 12 by a portion of the channel region 10. The top surface of the portion of channel region 10 that is disposed between a source region 16 and semiconductor body 12 lies beneath a gate oxide layer 18 which insulates it from a respective gate electrode 20. The device also includes source contact 22 which is in electrical contact with source regions 16, and drain contact 24 which is in electrical contact with substrate 14. Source contact 22 is also in electrical contact with high conductivity contact regions 30 which are formed in and are of the same conductivity as channel regions 10. The purpose of high conductivity regions 30 is to short source regions 16 and channel region 10 with a low resistivity connection to prevent a parasitic bipolar device from turning on.

As is well known, by application of a proper voltage to a gate electrode 20 a channel is created in channel region 10, through what is typically referred to as inversion. The channel so created extends between the semiconductor body 12 and a respective source region 16 and allows for the passing of current between the two. Thus, current between source regions 16 and semiconductor body 12 can be turned ON/OFF by respective application and withdrawal of voltage to gate electrodes 20. It should be noted that current passes between source contact 22, which is in electrical contact with source regions 16, and drain contact 24 which is in electrical contact with semiconductor substrate 14, through common conduction region or drift region 26 in semiconductor body 12. Thus, the resistance of drift region 26 is a major contributor to the overall resistance of the device during its operation (Rdson).

One way to improve the Rdson of the device is to decrease the resistance of drift region 26 by increasing the concentration of the dopants contained therein. The increase in the concentration of dopants, however, undesirably reduces the ability of the device to withstand breakdown under reverse voltage conditions (Breakdown Voltage).

The breakdown voltage and the Rdson are important device characteristics. Usually, it is desirable to have a device with low Rdson and high breakdown voltage. However, because improvement in Rdson adversely affects the breakdown voltage and vice versa designers often have to select less than ideal values for Rdson and the breakdown voltage when designing a power MOSFET.

To address this problem, superjunction devices have been devised to allow for a lower Rdson and higher breakdown voltage. FIG. 1B shows the cross-section of a portion of a power MOSFET according to prior art that employs a superjunction feature to reduce the Rdson but increase the breakdown voltage of the device. The device shown by FIG. 1B includes spaced columns 28 of a conductivity opposite to that of the drift region 26 formed in semiconductor body 12 below channel regions 10. The charge in columns 28 are selected such that under reverse a voltage condition the drift region 26 and columns 28 deplete fully, thereby improving the ability of the device to withstand breakdown. Typically, the charge in columns 28 is selected such that each column is in charge balance with its surrounding drift region 26. By providing columns 28 to improve the breakdown voltage of the device the concentration of dopants in drift region 26 may be increased, which results in improvement of Rdson. Thus, Rdson and breakdown voltage may be improved at the same time.

A device according to FIG. 1B is manufactured by first epitaxially growing multiple semiconductor layers and forming a portion of each column 28 through implantation and diffusion each time a layer of semiconductor is grown. After several layers of semiconductor material are formed, semiconductor body 12 containing columns 28 of opposite conductivity is subjected to further processing so that the device features such as channel regions and source regions can be formed to obtain a device. Because it is desirable to have the channel regions 10 formed over columns 28 (in order to have the shortest possible drift region to obtain the lowest possible Rdson) the processing of a device according to FIG. 1 requires critical alignment steps during photolithography to align channel regions 10 and other features. Such critical alignments complicate processing, which may result in low yields. Furthermore because the minimum cell size may be limited by the capability of the photolithographic equipment, critical alignment can reduce the number of cells per unit area thus adversely affecting the maximum current carrying capability of the device.

SUMMARY OF THE INVENTION

A power switching device such as a power MOSFET according to the present invention includes breakdown voltage enhancement region formed in the drift region for improving the breakdown voltage of the device.

According to the present invention the breakdown voltage enhancement regions are formed by deep, high energy implantation of dopants and are self-aligned to avoid the need for a critical masking alignments. The self-alignment of the breakdown voltage enhancement regions simplifies the manufacturing process, and allows for a more compact arrangement of the cells in the device, thereby improving the current carrying capability of the device as well.

Other features and advantages of the present invention will become apparent from the following description of the invention which refers to the accompanying drawings.

DETAILED DESCRIPTION OF THE DRAWINGS

Figure 1A:
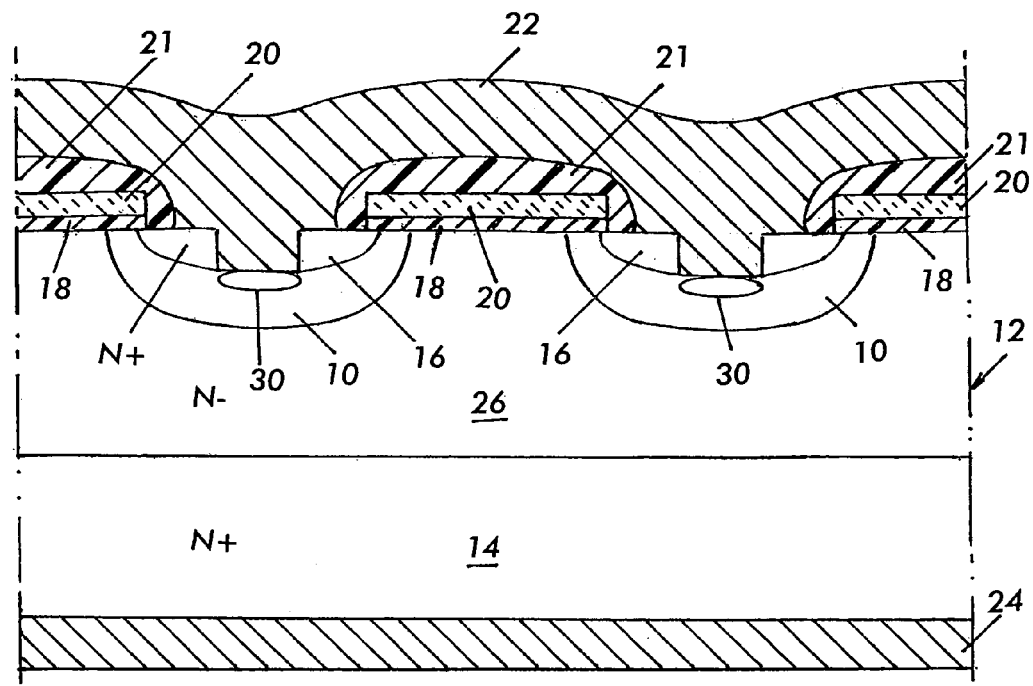
FIG. 1A is a cross-sectional view of a portion of a power MOSFET according to prior art.
Figure 1B:
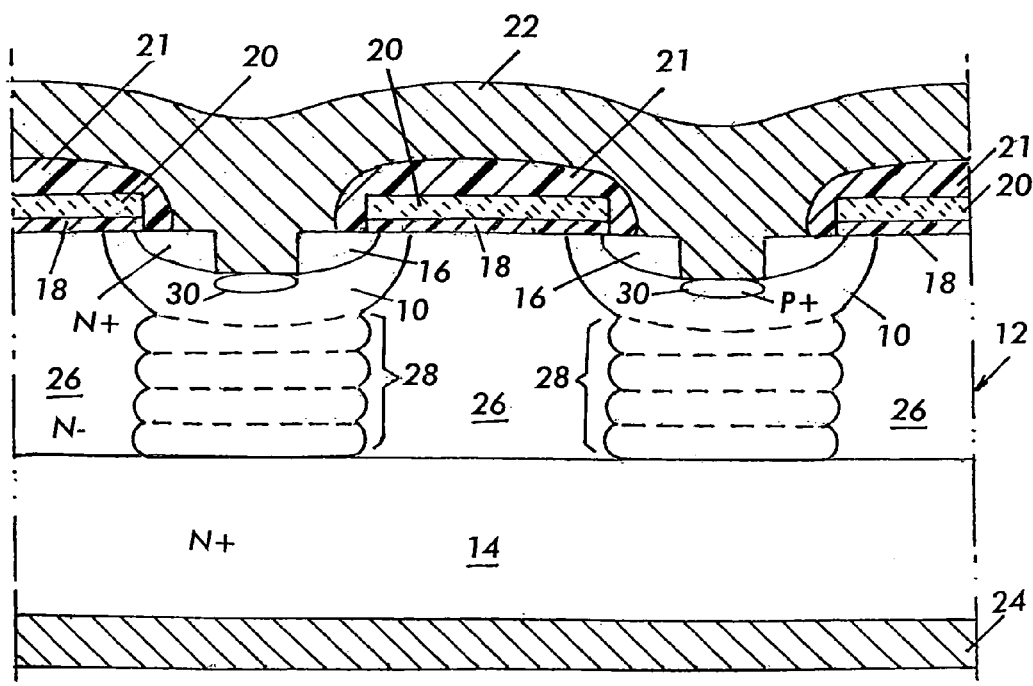
FIG. 1B is a cross-sectional view of a portion of another power MOSFET according to prior art.
Figure 2:
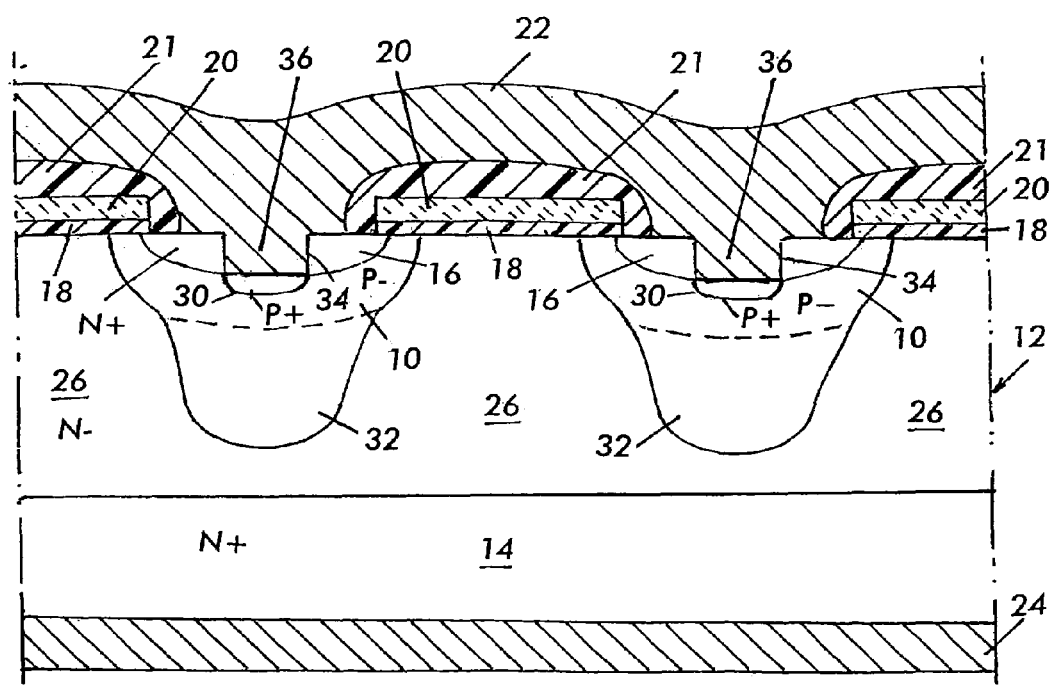
FIG. 2 is a cross-sectional view of a portion of a power MOSFET according to the present invention.

Referring now to FIG. 2, a device according to the present invention includes all of the features of the prior art including, a plurality of spaced channel regions 10, respective source regions 16 and high conductivity contact regions 30 in each channel region 10, source contact 22 in electrical contact with source regions 16 and high conductivity contact regions 30, gate structures each comprised of a gate insulation 18 and a gate electrode 20, each formed over at least a respective invertible channel, and drain contact 24 formed on and in electrical contact with substrate 24.

According to the present invention, breakdown voltage enhancement regions 32 of opposite conductivity type to drift region 26 are formed in semiconductor body 12. Breakdown voltage enhancement regions 10 are preferably formed under channel regions 32 to keep the shortest path of conduction clear for the current. According to the present invention, breakdown voltage enhancement regions 32 are doped such that they are in charge balance with their surroundings. That is, breakdown voltage enhancement regions 32 are in charge balance with the surrounding drift region 26. As a result of the charge balance, breakdown voltage enhancement regions 32 and the surrounding drift region 26 deplete one another under a reverse voltage condition thereby increasing the ability of the device to withstand breakdown and thus improving the breakdown voltage of the device. Because of the improvement in the breakdown voltage of the device, drift region 26 can be made less resistive (i.e., more highly doped) with less concern for an adverse affect on the breakdown voltage of the device. Thus, by including the breakdown voltage enhancement regions 32, the Rdson of the device may be lowered while its breakdown voltage may be increased.

According to an aspect of the present invention, breakdown voltage enhancement regions 32 may be formed by high energy implantation of dopants into the semiconductor body 12. High energy implantation is advantageous in that it eliminates the need for multiple steps of epitaxial growth which is needed to produce columns 28 of opposite conductivity as required in the prior art devices. Naturally, multiple alignment steps including critical alignment for forming the components of the active region of the device such as channel regions may also be eliminated, thereby allowing for a more compact arrangement of the cells. A more compact arrangement of cells allows for an increase in the current carrying ability of the device.

According to another aspect of the invention, breakdown voltage enhancement regions 32 may be self-aligned, for example, with a feature of the device, thereby eliminating a need for a critical mask step.

Figure 3A:
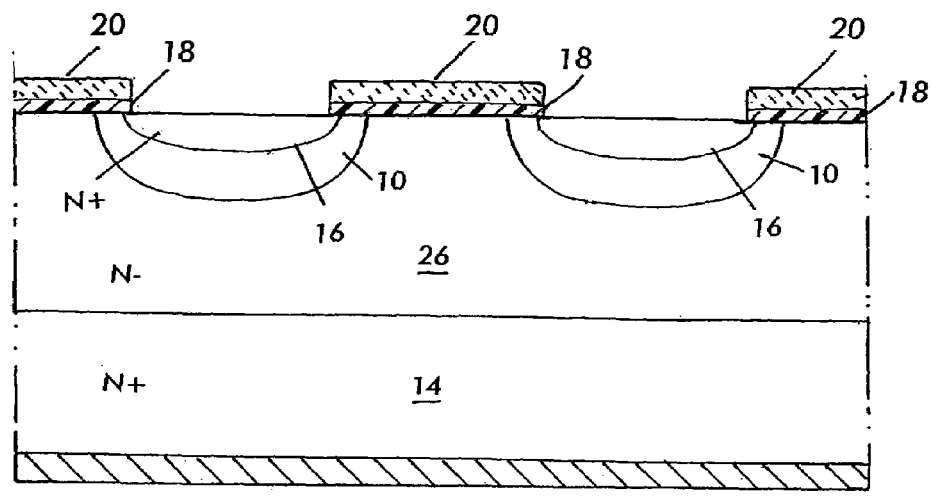
FIGS. 3A-3C illustrate a set of steps for forming a device according to the present invention.
Figure 3B:
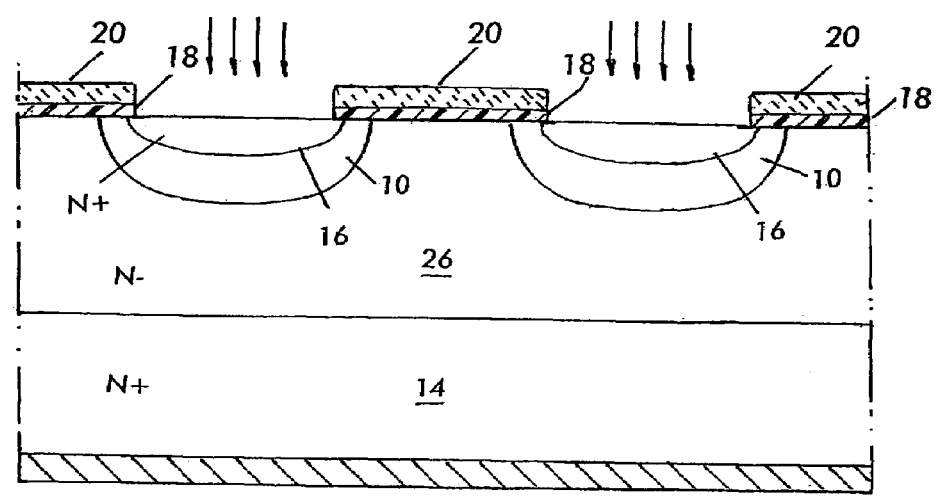
Figure 3C:
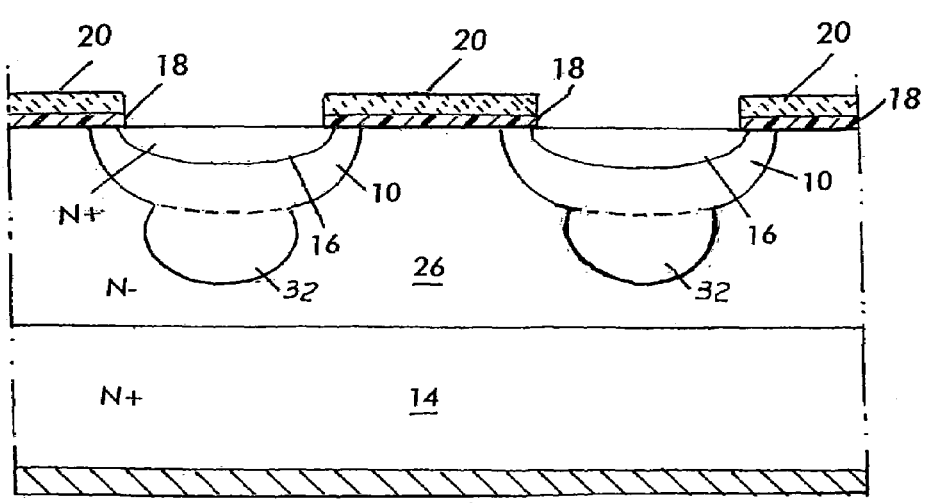

Referring for example to FIGS. 3A-3C, in one embodiment, the channel regions 10 and source regions 16 may be formed using a conventional double diffusion process. In such a process, first the gate structures are formed on the top surface of semiconductor body 12, and channel regions 10 and source regions 16 are aligned to the sidewalls of the gate structures without a need for a mask. Thus, for example, first channel regions 10 are formed by implantation and diffusion of dopants into semiconductor body 12 using the gate structures as a mask. Then, source regions 16 are formed in channel regions 10 by implantation and diffusion. FIG. 3A shows the resulting structure after these steps.

According to the present invention, after channel regions 10 and source regions 16 are formed, for example, by a double-diffusion technique, one or more high energy implant steps can be carried out using the gate structures as a mask (see FIG. 3B). After implantation a short diffusion drive can be applied to activate the implanted dopants to form the breakdown voltage enhancement regions 32. The diffusion drive applied may be short enough so that the final lateral dimension of the breakdown voltage enhancement regions 32 will not extend beyond the lateral extent of channel regions 10.

As explained above, breakdown voltage enhancement regions 32 will be doped so that they will be in charge balance with the surrounding drift regions 26. It should be noted that in the embodiment shown by FIG. 2, the breakdown voltage enhancement regions 32 are merged with channel regions 10. Alternatively, breakdown voltage enhancement regions 32 may be formed without being merged with channel regions 10.

Figure 4A:
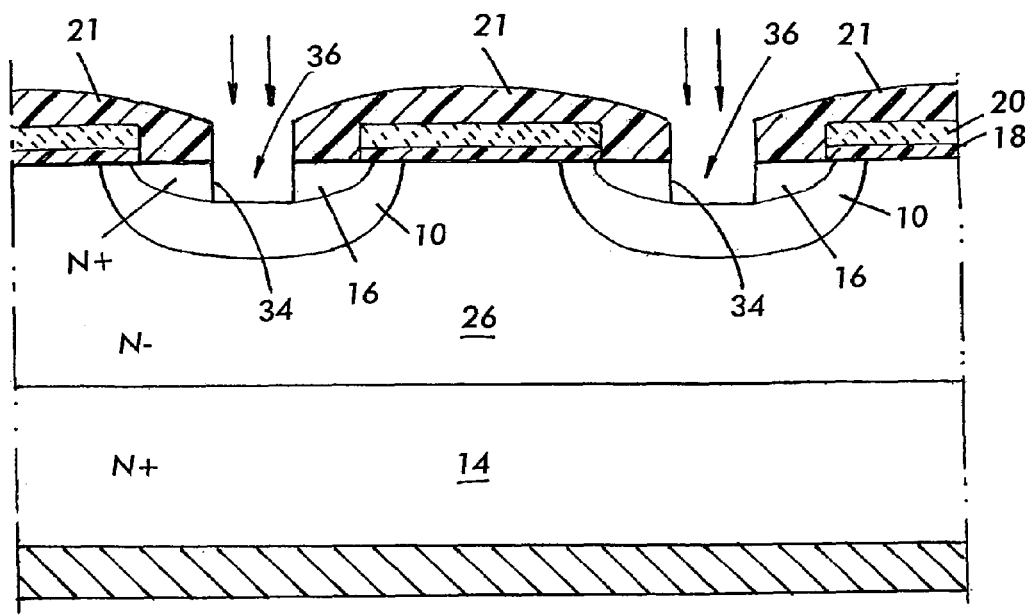
FIGS. 4A-4B illustrate an alternate set of steps for forming a device according to the present invention.
Figure 4B:
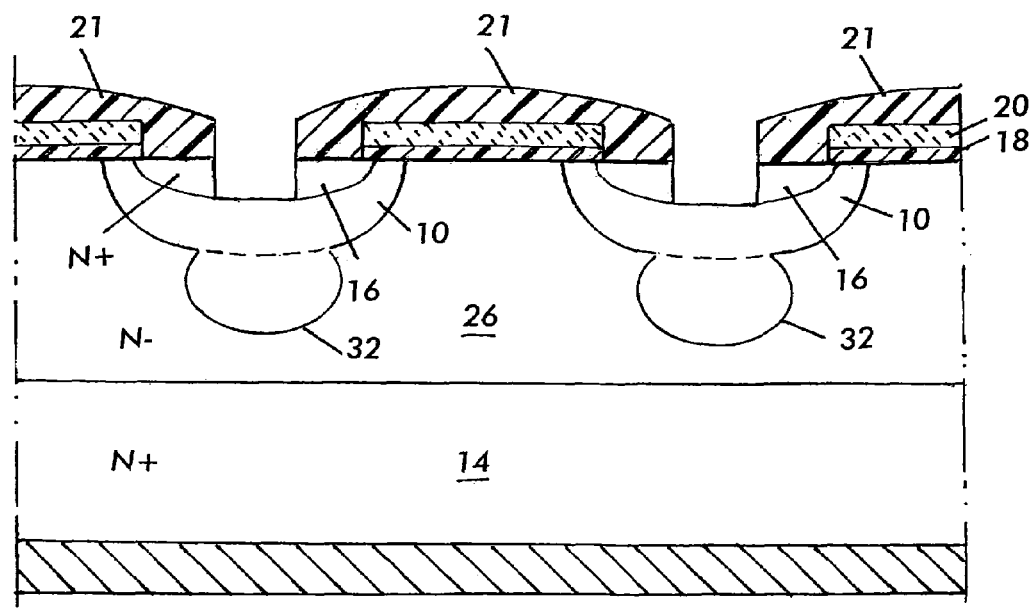

Referring now to FIGS. 4A-4B, in an alternative embodiment, breakdown voltage enhancement regions 32 may be self-aligned with the depression walls 34 of depression 36 in source regions 16. Thus, after or before high conductivity contact regions 30 are formed at the bottom of depressions 36, breakdown voltage enhancement regions 32 may be formed by implanting dopants below channel regions 10 using the same mask or structure which is used for implanting the dopants that form the high conductivity contact regions 30 (see FIG. 4A). Thus, breakdown voltage enhancement regions 32 may be self-aligned with the high conductivity regions 30 without a need for a separate critical masking step.

For example, according to one conventional process, depressions 36 are formed by first creating a passage through oxide layer 21 and anisotropic etching of semiconductor below the passage to create depressions 36 through source region 16. According to this conventional process, high conductivity contact regions 30 are formed by implanting dopants at the bottom of depressions 36 using the sidewalls of oxide layer 21 and depressions 36 as a mask.

According to the present invention, this conventional process is modified to include high energy implantation of dopants in one or more steps below channel regions 10 using the same structure that is used as a mask for forming high conductivity contact regions 30. As a result, breakdown voltage enhancement regions 32 are formed through self-alignment without a need for a critical masking step.

Figure 5:
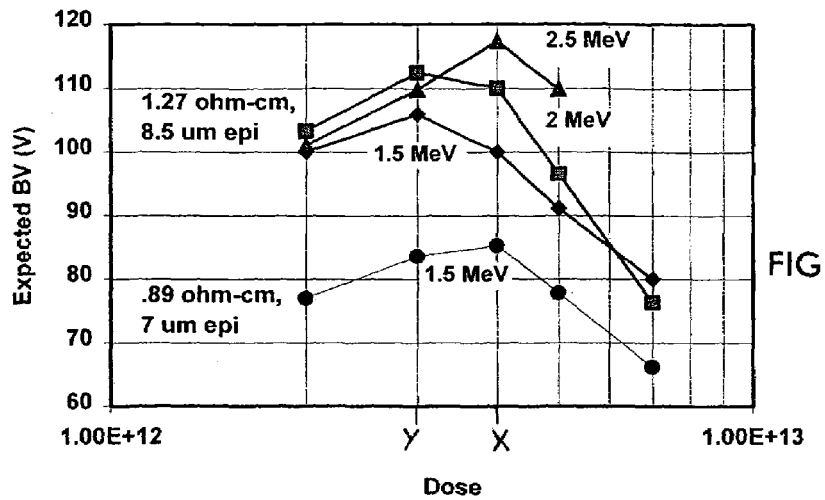
FIG. 5 graphically shows simulated breakdown voltage values for a device according to the present invention.

Referring now to FIG. 5, simulations have shown that breakdown voltage of the device can be improved by inclusion of breakdown voltage enhancement regions 32. FIG. 5 also illustrates that given a drift region of a given thickness and conductivity, the dosage of the implants for forming breakdown voltage enhancement regions 32 and the depth of the breakdown voltage enhancement regions (as represented by the implant energy) can be adjusted to gain higher breakdown voltages. Thus, for example, when the drift region has a conductivity of 1.27 ohm-μm and a thickness of 8.5 μm, an implant energy of 2.5 MeV can result in a higher breakdown voltage of one dosage amount (marked as X on the graph) but have a slightly lower breakdown voltage at another dosage amount (marked with Y on the graph) compared to implants at other depths. Thus, the depth as well as the dosage of dopants can be adjusted to create breakdown voltage enhancement regions 32 to improve the breakdown voltage of the device.

Figure 6:
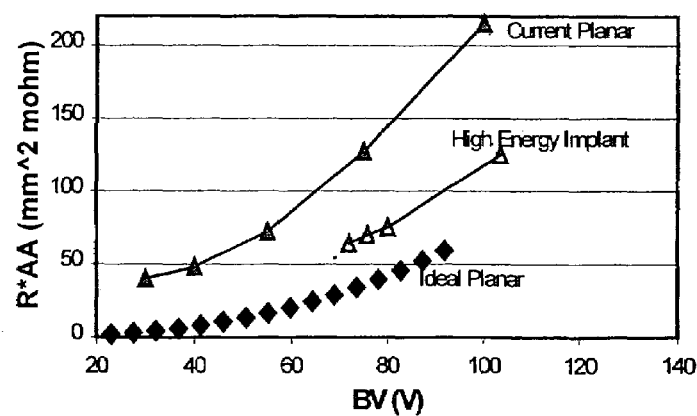
FIG. 6 graphically shows sheet resistance values for an ideal planar device, a device according to prior art and device according to the present invention.

FIG. 6 shows that the sheet resistance (RxAA) in a device that includes breakdown voltage enhancement regions 32 can be higher than an ideal device, but is lower compared to a conventional planar device, thus showing that the Rdson of a device according to the present invention is lower than a conventional device.

Figure 7:
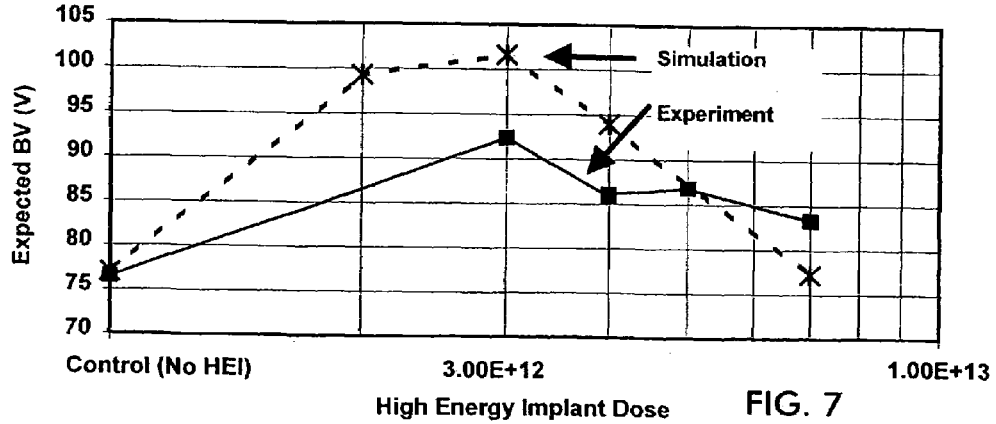
FIG. 7 graphically shows a comparison of breakdown voltage values for a simulated device according to the present invention and an actual device according to the present invention.

Referring now to FIG. 7, experiments have illustrated that simulations of the breakdown voltage of a device according to the present invention and a manufactured device according to the present invention largely agree. The discrepancy between simulated and experimental values is believed to be the result of premature breakdown in the termination area.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A process for manufacturing a power semiconductor device, comprising:

providing a semiconductor body of a first conductivity and first charge level;

forming a plurality of spaced gate structures on said semiconductor body, each gate structure including at least a gate insulation body, and a gate electrode;

implanting first dopants of a second conductivity into said semiconductor body through spaces between said gate structures;

diffusing said first dopants of said second conductivity to form a plurality of channel regions;

implanting dopants of said first conductivity into said channel regions through said spaces between said gate structures to form source implant regions;

implanting second dopants of said second conductivity through said spaces between said gate structures to a depth below the depth of said channel regions; and diffusing said second dopants to form breakdown voltage enhancing regions having a second charge level; wherein said first charge level and said second charge level are such that said breakdown voltage enhancing regions and said semiconductor body deplete one another under application of a reverse voltage.

2. The process of claim 1, wherein said second dopants are diffused until said each channel region merges with a respective breakdown voltage enhancing region.

3. The process of claim 1, wherein said second dopants are diffused such that the lateral dimension of each said breakdown enhancing region is less than a respective channel region disposed vertically adjacent thereto.

4. The process of claim 1, further comprising forming an insulation body over each gate structure prior to implanting said second dopants, each insulation body being spaced from another insulation body, and implanting said second dopants through said spaces between said insulation bodies.

5. The process of claim 4, further comprising implanting third dopants of said second conductivity in each channel region through spaces between said insulation bodies to form contact regions.

6. The process of claim 4, further comprising forming a depression into each channel region prior to implanting said second dopants.

* * * * *